(12) United States Patent
Luo et al.

(10) Patent No.: US 9,432,056 B2
(45) Date of Patent: Aug. 30, 2016

(54) FAST DECODING BASED ON ZIGZAG DECONVOLUTION FOR RANDOM PROJECTION CODE

(71) Applicant: Microsoft Technology Licensing, LLC, Redmond, WA (US)

(72) Inventors: Chong Luo, Beijing (CN); Hao Cui, Beijing (CN); Feng Wu, Beijing (CN); Chang Wen Chen, East Amherst, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/071,418

(22) Filed: Nov. 4, 2013

(65) Prior Publication Data
US 2015/0124908 A1    May 7, 2015

(51) Int. Cl.
| | |
|---|---|
| H03K 9/00 | (2006.01) |
| H04B 15/00 | (2006.01) |
| H03M 13/11 | (2006.01) |
| H04L 1/00 | (2006.01) |

(52) U.S. Cl.
CPC ...... *H03M 13/1171* (2013.01); *H03M 13/1111* (2013.01); *H04L 1/005* (2013.01); *H04L 1/0058* (2013.01)

(58) Field of Classification Search
USPC .................. 375/240, 240.23, 240.24, 240.25, 375/240.26, 240.27, 262, 263, 265, 264, 375/278, 277, 276, 285, 284, 286, 287, 290, 375/295, 316, 340, 341, 342, 346, 347, 348, 375/349, 324, 371, 362, 365
See application file for complete search history.

(56) References Cited

U.S. PATENT DOCUMENTS

| | | | |
|---|---|---|---|
| 5,570,369 | A | 10/1996 | Jokinen |
| 6,185,418 | B1 | 2/2001 | MacLellan et al. |
| 6,892,343 | B2 | 5/2005 | Sayood et al. |
| 6,928,592 | B2 | 8/2005 | Barrett |
| 7,197,690 | B2 | 3/2007 | Shen et al. |
| 7,265,682 | B2 | 9/2007 | Memarzadeh et al. |
| 7,271,747 | B2 | 9/2007 | Baraniuk et al. |
| 7,292,583 | B2 | 11/2007 | Schoenblum |
| 7,447,978 | B2 | 11/2008 | Hannuksela |

(Continued)

FOREIGN PATENT DOCUMENTS

| | | | | |
|---|---|---|---|---|
| EP | 2169836 A1 | * | 3/2010 | ............ H03M 13/11 |
| WO | WO2011150315 A2 | | 12/2011 | |

OTHER PUBLICATIONS

Aditya, et al., "Flexcast: Graceful Wireless Video Streaming", In Proceedings of the 17th Annual International Conference on Mobile Computing and Networking, Sep. 19, 2011, 12 pages.

(Continued)

*Primary Examiner* — Linda Wong
(74) *Attorney, Agent, or Firm* — Steve Wight; Sandy Swain; Micky Minhas

(57) ABSTRACT

Multi-level symbols generated by applying a Random Projection Code (RPC) to a source bit sequence are received at a receiver via a noisy channel. The received multi-level symbols are represented in a bipartite graph as constraint nodes connected via weighted edges to binary variable nodes that represent the source bit sequence. A decoder uses ZigZag deconvolution to generate constraint node messages as part of an iterative belief propagation to decode the source bit sequence from the received multi-level symbols.

20 Claims, 7 Drawing Sheets

(56) References Cited

U.S. PATENT DOCUMENTS

| | | | |
|---|---|---|---|
| 7,555,064 | B2 | 6/2009 | Beadle |
| 7,672,392 | B2 | 3/2010 | Johansson |
| 7,715,333 | B2 | 5/2010 | Binzel et al. |
| 7,760,699 | B1 | 7/2010 | Malik |
| 2006/0190799 | A1* | 8/2006 | Kan et al. ............ 714/758 |
| 2007/0223620 | A1 | 9/2007 | Kalhan et al. |
| 2009/0235060 | A1* | 9/2009 | Yokokawa et al. ......... 712/236 |
| 2010/0074552 | A1* | 3/2010 | Sun et al. ............ 382/264 |
| 2010/0100792 | A1 | 4/2010 | Abu-Surra |
| 2010/0157901 | A1 | 6/2010 | Sanderovitz et al. |
| 2010/0195768 | A1* | 8/2010 | Krakowski ............ 375/320 |
| 2010/0199153 | A1* | 8/2010 | Okamura et al. ......... 714/781 |
| 2011/0141918 | A1* | 6/2011 | Li ............ 370/252 |
| 2011/0200088 | A1 | 8/2011 | Koslov et al. |
| 2011/0246848 | A1 | 10/2011 | Yue et al. |
| 2012/0121030 | A1 | 5/2012 | Luo et al. |

OTHER PUBLICATIONS

Ardakani, Masoud, "Efficient Analysis, Design and Decoding of Low-Density Parity-Check Codes", A Thesis Submitted in Conformity with the Requirements for the Degree of Doctor of Philosophy, Jul. 4, 2013, 164 pages.

Arslan, et al., "Generalized Unequal Error Protection LT Codes for Progressive Data Transmission", In IEEE Transactions on Image Processing, vol. 21, Issue 8, Aug. 2012, 12 pages.

Bajwa, et al., "Joint Source-Channel Communication for Distributed Estimation in Sensor Networks", In IEEE Transactions on Information Theory, vol. 53, Issue 10, Oct. 2007, 25 pages.

Baron, et al., "Bayesian Compressive Sensing via Belief Propagation", retrieved on Aug. 2, 2010 at <<http://arxiv.org/pdf/0812.4627v2>>, IEEE Transactions on Signal Processing, vol. 58, No. 1, Jan. 2010, pp. 269-280.

Berrou, et al., "Near Shannon Limit Error-Correcting Coding and Decoding: Turbo-Codes", retrieved on Aug. 2, 2010 at <<http://www.google.co.in/url?sa=t&source=web&cd=1&ved=0CBUQFjAA&url=http%3A%2F%2Fciteseerx.ist.psu.edu%2Fviewdoc%2Fdownload%3Fdoi%3D10.1.1.135.9318%26rep%3Drep1%26type%3Dpdf&rct=j&q=.%20Near%20shannon%20limit%20error-correcting%20coding%20and%20decoding&ei=KJIWTNDxJ8n64AbpxPymBQ&usg=AFQjCNG_4vUdVd-A-bwD9-83yM8rWrUe8A>>, IEEE, IEEE International Conference on Communications, 1993. vol. 2, May 23-26, 1993, pp. 1064-1070 vol. 2.

Bicket, "Bit-rate Selection in Wireless Networks", retrieved on Aug. 2, 2010 at <<http://www.comp.nus.edu/~bleong/geographic/related/jbicket-ms-itrate_selection.pdf>>, Massachusetts Institute of Technology, Masters Thesis, Feb. 2005, pp. 1-50.

Blumensath, et al., "Iterative Hard Thresholding for Compressed Sensing", In Proceedings of Applied and Computational Harmonic Analysis, vol. 27, Issue 3, Nov. 2009, 27 pages.

Brink, Stephan Ten, "Convergence Behavior of Iteratively Decoded Parallel Concatenated Codes", In IEEE Transactions on Communications, vol. 49, Issue 10, Oct. 2001, 11 pages.

Brink, et al., "Design of Low-Density Parity-Check Codes for Modulation and Detection", In IEEE Transactions on Communications, vol. 52, Issue 4, Apr. 2004, 9 pages.

Brown, et al., "Adaptive Demodulation Using Rateless Erasure Codes", retrieved on Aug. 2, 2010 at <<http://www.dsp.utoronto.ca/~kostas/Publications2008/pub/91.pdf>>, IEEE Transactions on Communications, vol. 54, No. 9, Sep. 2006, pp. 1574-1585.

Bursalioglu, et al., "Joint Source-Channel Coding for Deep Space Image Transmission Using Rateless Codes", In Information Theory and Applications Workshop, Feb. 6, 2011, 10 pages.

Cabarcas, et al., "Turbo Coding of Strongly Nonuniform Memoryless Sources with Unequal Energy Allocation and Pam Signaling", In IEEE Transactions on Signal Processing, vol. 54, Issue 5, May 2006, 5 pages.

Caire, et al., "A New Data Compression Algorithm for Sources with Memory Based on Error Correcting Codes", In IEEE Information Theory Workshop, Mar. 31, 2003, 5 pages.

Caire, et al., "Bit-Interleaved Coded Modulation", retrieved on Aug. 2, 2010 at <<http://ieeexplore.ieee.org/stamp/stamp.jsp?tp=&arnumber=669123>>, IEEE Transactions on Information Theory, vol. 4, No. 3, May 1998, pp. 927-946.

Caire, et al., "Fountain Codes for Lossless Data Compression", In Proceedings of DIMACS Series in Discrete Mathematics and Theoretical Computer Science, Dec. 2005, 19 pages.

Calderbank, "Multilevel Codes and Multistage Decoding", retrieved on Aug. 2, 2010 at <<http://ieeexplore.ieee.org/stamp/stamp.jsp?arnumber=00020095>>, IEEE Transactions on Communications, vol. 37, No. 3, Mar. 1989, pp. 222-229.

Candes, Emamnuel J., "Compressive Sampling", In Proceedings of the International Congress of Mathematicians, Aug. 22, 2006, 20 pages.

Candes, et al., "Robust Uncertainty Principles: Exact Signal Reconstruction from Highly Incomplete Frequency Information", retrieved on Aug. 2, 2010 at <<http://www-stat.stanford.edu/~candes/papers/ExactRecovery.pdf>>, IEEE Transactions on Information Theory, vol. 52, 2006, pp. 489-509.

Ceire, et al., "Universal Variable-Length Data Compression of Binary Sources using Fountain Codes", In IEEE Transactions on Information Theory, Oct. 24, 2004, 6 pages.

Chen, et al., "Energy-Aware Design of Compressed Sensing Systems for Wireless Sensors Under Performance and Reliability Constraints", In IEEE Transactions on Circuits and Systems I: Regular Papers, vol. 60, Issue 3, Mar. 2013, 12 pages.

Chen, et al., "Reduced-Complexity Decoding of LDPC Codes", In IEEE Transactions on Communications, vol. 53, Issue 8, Aug. 2005, 12 pages.

Cui, et al., "Seamless Rate Adaptation for Wireless Networking", In Proceedings of the 14th ACM International Conference on Modeling, Analysis and Simulation of Wireless and Mobile Systems, Oct. 31, 2011, 9 pages.

Dai, et al., "Subspace Pursuit for Compressive Sensing Signal Reconstruction", In IEEE Transactions on Information Theory, vol. 55, Issue 5, May 2009, 20 pages.

Donoho, "Compressed Sensing", retrieved on Aug. 2, 2010 at <<http://stat.stanford.edu/~donoho/Reports/2004/CompressedSensing091604.pdf>>, IEEE Transactions on Information Theory, vol. 52, No. 4, Apr. 2006, pp. 1289-1306.

Donoho, et al., "Fast Solution of 1-Norm Minimization Problems When the Solution May be Sparse", In IEEE Transactions on Information Theory, vol. 54, Issue 11, Nov. 2008, 45 pages.

Duarte, et al., "Universal Distributed Sensing Via Random Projections", In Proceedings of the 5th International Conference on Information Processing in Sensor Networks, Apr. 19, 2006, 9 pages.

Feizi, et al., "A Power Efficient Sensing/Communication Scheme: Joint Source-Channel-Network Coding by Using Compressive Sensing", In Proceedings of 49th Annual Allerton Conference on Communication, Control, and Computing, Sep. 28, 2011, 7 pages.

Feizi, et al., "Compressive Sensing Over Networks", In Proceedings of 48th Annual Allerton Conference on Communication, Control, and Computing, Sep. 29, 2010, 8 pages.

Fresia, et al., "Optimized Concatenated LDPC Codes for Joint Source-Channel Coding", In IEEE International Symposium on Information Theory, vol. 3, Jun. 28, 2009, 5 pages.

Gallager, "Low-Density Parity-Check Codes", retrieved on Aug. 2, 2010 at <<http://www.rle.mit.edu/rgallager/documents/ldpc.pdf>>, Massachusetts Institute of Technology, PhD Dissertation, Jul. 1963, pp. 1-90.

Gorgoglione, Matteo, "Analysis and Construction of Non-Binary LDPC Codes for Fading Channels", In PHD Thesis, Oct. 25, 2012, 161 pages.

Gudipati, et al., "Strider: Automatic Rate Adaptation and Collision Handling", In Proceedings of the ACM SIGCOMM Conference, Aug. 15, 2011, 12 pages.

Hamzaoui, et al., "Optimized Error Protection of Scalable Image Bit Streams [Advances in Joint Source-Channel Coding of Images]", In IEEE of Signal Processing Magazine, vol. 22, Issue 6, Nov. 2005, 17 pages.

(56) References Cited

OTHER PUBLICATIONS

He, et al., "Joint Source Channel Rate-Distortion Analysis for Adaptive Mode Selection and Rate Control in Wireless Video Coding", In IEEE Transactions on Circuits and Systems for Video Technology, vol. 12, Issue 6, Jun. 2002, 13 pages.
Holland, et al., "A Rate-Adaptive MAC Protocol for Multi-Hop Wireless Networks", retrieved on Aug. 2, 2010 at <<http://www.ee.oulu.fi/~carlos/papers/MAC/HO01.pdf>>, ACM/IEEE International Conference on Mobile Computing and Networking (MOBICOM), Rome, Italy, Jul. 2001, pp. 1-15.
"IEEE Standard for Information technology—Telecommunications and information exchange between systems—Local and metropolitan area networks—Specific requirements, Part 11: Wireless LAN Medium Access Control (MAC) and Physical Layer (PHY) Specifications", retrieved on Aug. 2, 2010 at <<http://standards.ieee.org/getieee802/download/802.11-2007.pdf>>, IEEE Computer Society, IEEE Std 802.11-2007, 2007, pp. 1-1233.
Imai, et al., "A New Multilevel Coding Method Using Error-Correcting Codes", retrieved on Aug. 2, 2010 at <<http://ieeexplore.ieee.org/stamp/stamp.jsp?tp=&arnumber=1055718>>, IEEE Transactions on Information Theory, vol. IT-23, No. 3, 1977, pp. 371-377.
Jakubczak, et al., "A Cross-Layer Design for Scalable Mobile Video", In Proceedings of the 17th Annual International Conference on Mobile Computing and Networking, Sep. 19, 2011, 13 pages.
Ji, et al., "Bayesian Compressive Sensing", retrieved on Aug. 2, 2010 at <<http://people.ee.duke.edu/~shji/papers/BCS_preprint.pdf>>, ACM, Proceedings of International Conference on Machine Learning (ICML), Corvalis, Oregon, vol. 227, 2007, pp. 377-384.
Judd, et al., "Efficient Channel-aware Rate Adaptation in Dynamic Environments", retrieved on Aug. 2, 2010 at <<http://www.cse.iitb.ac.in/~victor/seminar/charm.pdf>>, ACM, Proceedings of International Conference on Mobile Systems, Applications and Services (MOBISYS), Breckenridge, Colorado, Jun. 2008, pp. 118-131.
Kim, et al., "Optimal Rate Adaptation for Hybrid ARQ in Time-Correlated Rayleigh Fading Channels", In IEEE Transactions on Wireless Communications, vol. 10, Issue 3, Mar. 2011, 12 pages.
Kondi, et al., "Joint Source-Channel Coding for Motion-Compensated DCT-Based SNR Scalable Video", In IEEE Transactions on Image Processing, vol. 11, Issue 9, Sep. 2002, 10 pages.
Liu, et al., "Formulating Binary Compressive Sensing Decoding with Asymmetrical Property", In Proceedings of the Data Compression Conference, Mar. 29, 2011, 10 pages.
Liveris, et al., "Compression of Binary Sources with Side Information at the Decoder using LDPC Codes", In IEEE Communications Letters, vol. 6, Issue 10, Oct. 2002, 3 pages.
Luby, "LT Codes", retrieved on Aug. 2, 2010 at <<http://www.inference.phy.cam.ac.uk/mackay/dfountain/LT.pdf>>, IEEE Computer Society, Proceedings of Symposium on Foundations of Computer Science (FOCS), 2002, pp. 1-10.
MacKay, et al., "Near Shannon Limit Performance of Low Density Parity Check Codes", retrieved on Aug. 2, 2010 at <<http://eref.uqu.edu.sa/files/Others/Ldpc/LDPC%20Theory/Near%20Shannon%20limit%20performance%20of%20low%20density%20parity%20check%20c.pdf>>, Electronic Letters, vol. 33, No. 6, Mar. 13, 1997, pp. 457-458.
Martinez, et al., "Bit-Interleaved Coded Modulation Revisited: A Mismatched Decoding Perspective", retrieved on Aug. 2, 2010 at <<http://oai.cwi.nl/oai/asset/14635/14635B.pdf>>, IEEE Transactions on Information Theory, vol. 55, No. 6, Jun. 2009, pp. 2756-2765.
Nana, et al., "Improved Decoding of LDPC Coded Modulations", In IEEE Communications Letters, vol. 10, Issue 5, May 2006, 3 pages.
Nanda, et al., "Adaptation Techniques in Wireless Packet Data Services", In IEEE on Communications Magazine, vol. 38, Issue 1, Jan. 2000, 11 pages.
Non-Final Office Action for U.S. Appl. No. 12/945,741, mailed on Apr. 2, 2013, Chong Luo et al., "Compressive Wireless Modulation", 9 pages.
Pan, et al., "Combined Source and Channel Coding with JPEG2000 and Rate-Compatible Low-Density Parity-Check Codes", In IEEE Transactions on Signal Processing, vol. 54, Issue 3, Mar. 2006, 5 pages.
Perry, et al., "Rateless Spinal Codes", In Proceedings of the 10th ACM Workshop on Hot Topics in Networks, Nov. 14, 2011, 6 pages.
Pretti, "A message-passing algorithm with damping", retrieved on Aug. 2, 2010 at <<http://iopscience.iop.org/1742-5468/2005/11/P11008/pdf/jstat5_11_p11008.pdf>>, IOP Publishing, Journal of Statistical Mechanics: Theory and Experiment, Nov. 2005, pp. 1-16.
Pusane, et al., "Reduced Complexity Decoding Strategies for LDPC Convolutional Codes", In Proceedings of the International Symposium on Information Theory, Jun. 27, 2004, 1 page.
Rowitch, et al., "On the Performance of Hybrid FEC/ARQ Systems using Rate Compatible Punctured Turbo (RCPT) Codes", In IEEE Transactions on Communications, vol. 48, Issue 6, Jun. 2000, 12 pages.
Sartipi, et al., "Source and Channel Coding in Wireless Sensor Networks using LDPC Codes", In IEEE Communications Society Conference on Sensor and Ad Hoc Communications and Networks, Oct. 4, 2004, 8 pages.
Sarvotham, et al., "Measurements vs. Bits: Compressed Sensing meets Information Theory", retrieved on Aug. 2, 2010 at <<http://dsp.rice.edu/sites/dsp.rice.edu/files/publications/conference-paper/2006/mvb-acccc-2006_0.pdf>>, Proceedings of Allerton Conference on Communication, Control and Computing, Monticello, IL, Sep. 2006, pp. 1-5.
Sarvotham, et al., "Sudocodes—Fast Measurement and Reconstruction of Sparse Signals", retrieved on Aug. 2, 2010 at <<http://citeseerx.ist.psu.edu/viewdoc/download?doi=10.1.1.119.9121&rep=rep1&type=pdf>>, IEEE International Symposium on Information Theory (ISIT), Seattle, WA, Jul. 2006, pp. 1-5.
Schenka, et al., "Performance Estimation of Bit-Interleaved Coded Modulation Based on Information Processing Characteristics", In IEEE International Symposium on Information Theory Proceedings, Jul. 1, 2012, 5 pages.
Schniter, et al., "Fast Bayesian Matching Pursuit: Model Uncertainty and Parameter Estimation for Sparse Linear Models", retrieved on Aug. 2, 2010 at <<http://www2.ece.ohio-state.edu/~zinielj/FBMP_TransSP.pdf>>, IEEE Transactions on Signal Processing, Mar. 2009, pp. 1-29.
Seeger, et al., "Compressed Sensing and Bayesian Experimental Design", retrieved on Aug. 2, 2010 at <<http://icml2008.cs.helsinki.fi/papers/459.pdf>>, ACM, Proceedings of International Conference on Machine Learning (ICML), Helsinki, Finland, vol. 307, 2008, pp. 912-919.
Ser, et al., "Joint Source-Channel Coding of Sources with Memory Using Turbo Codes and the Burrows-Wheeler Transform", In IEEE Transactions on Communications, vol. 58, Issue 7, Jul. 2010, 9 pages.
Shokrollahi, Amin, "Raptor Codes", In IEEE Transactions on Information Theory, vol. 52, Issue 6, Jun. 2006, 17 pages.
Shokrollahi, "Raptor Codes", retrieved on Aug. 2, 2010 at <<http://www.inference.phy.cam.ac.uk/mackay/dfountain/RaptorPaper.pdf>>, IEEE Transactions on Information Theory, vol. 52, No. 6, Jun. 2006, pp. 2551-2567.
Soijanin, et al., "Punctured vs Rateless Codes for Hybrid ARQ", In IEEE on Information Theory Workshop, Mar. 13, 2006, 5 pages.
Song, et al., "Threshold Optimization for Rate Adaptation Algorithms in IEEE 802.11 WLANS", In IEEE Transactions on Wireless Communications, vol. 9, Issue 1, Jan. 2010, 10 pages.
Tan, et al., "Sora: High Performance Software Radio Using General Purpose Multi-core Processors", retrieved on Aug. 2, 2010 at <<http://citeseerx.ist.psu.edu/viewdoc/download?doi=10.1.1.148.4181&rep=rep1&type=pdf>>, USENIX Association, Symposium on Networked Systems Design and Implementation (NSDI), 2009, pp. 75-90.
Tropp, et al., "Signal Recovery from Random Measurements via Orthogonal Matching Pursuit", In IEEE Transactions on Information Theory, vol. 53, Issue 12, Dec. 2007, 12 pages.
Ungerboeck, "Channel Coding with Multilevel/Phase Signals", retrieved on Aug. 3, 2010 at <<http://ieeexplore.ieee.org/stamp/stamp.jsp?tp=&arnumber=1056454>>, IEEE Transactions on Information Theory, vol. IT-28, No. 1, Jan. 1982, pp. 1-13.

(56) References Cited

OTHER PUBLICATIONS

Vutukuru, et al., "Cross-Layer Wireless Bit Rate Adaptation", retrieved on Aug. 2, 2010 at <<http://www.stanford.edu/class/cs244e/papers/softrate.pdf>>, ACM SIGCOMM Computer Communication Review, vol. 39, No. 4, 2009, pp. 3-14.

Wachsmann, et al., "Multilevel Codes:Theoretical Concepts and Practical Design Rules", retrieved on Aug. 2, 2010 at <<http://www.ensc.sfu.ca/people/faculty/cavers/ENSC805/readings/45it05-wachsmann.pdf>>, IEEE Transactions on Information Theory, vol. 45, No. 5, Jul. 1999, pp. 1361-1391.

Wang, et al., "Fast Decoding and Hardware Design for Binary-Input Compressive Sensing", In IEEE Journal on Emerging and Selected Topics in Circuits and Systems, vol. 2, Issue 3, Sep. 2012, 13 pages.

Wang, et al., "Improved Decoding Algorithm of Bit-Interleaved Coded Modulation for LDPC Code", In IEEE Transactions on Broadcasting, vol. 56, Issue 1, Mar. 2010, 7 pages.

Wong, et al., "Robust Rate Adaptation for 802.11 Wireless Networks", retrieved on Aug. 2, 2010 at <<http://citeseerx.ist.psu.edu/viewdoc/download?doi=10.1.1.87.4525&rep=rep1&type=pdf>>, ACM, Proceedings of International Conference on Mobile Computing and Networking (MOBCOM), Los Angeles, California, Sep. 2006, pp. 146-157.

Wu, et al., "Analysis on Rate-distortion Performance of Compressive Sensing for Binary Sparse Source", retrieved on Aug. 2, 2010 at <<http://74.125.155.132/scholar?q=cache:duOSbgC8dpIJ:scholar.google.com/&hl=en&as_sdt=2000>>, IEEE Data Compression Conference, 2009, pp. 113-122.

Xia, et al., "Smart Sender: A Practical Rate Adaptation Algorithm for Multirate IEEE 802.11 WLANS", In IEEE Transactions on Wireless Communications, vol. 7, Issue 5, May 2008, 12 pages.

Xu, et al., "Distributed Joint Source-Channel Coding of Video Using Raptor Codes", In IEEE Journal on Selected Areas in Communications, vol. 25, Issue 4, May 2007, 11 pages.

Zehavi, "8-PSK Trellis Codes for a Rayleigh Channel", retrieved on Aug. 2, 2010 at <<http://www.site.uottawa.ca/~yongacog/courses/achannelcoding/zeh.pdf>>, IEEE Transactions on Communications, vol. 40, No. 5, May 1992, pp. 873-884.

Zehavi, Ephraim, "8-Psk Trellis Codes for a Rayleigh Channel", In IEEE Transactions on Communications, vol. 40, Issue 5, May 1992, 12 pages.

Zhang, et al., "A Power-Optimized Joint Source Channel Coding for Scalable Video Streaming Over Wireless Channel", In IEEE International Symposium on Circuits and Systems, vol. 5, May 6, 2001, 4 pages.

Zhong, et al., "LDGM Codes for Channel Coding and Joint Source-Channel Coding of Correlated Sources", In Journal of EURASIP on Applied Signal Processing, Jan. 2005, 12 pages.

Zhu, et al., "Turbo Codes for Nonuniform Memoryless Sources Over Noisy Channels", In IEEE Communications Letters, vol. 6, Issue 2, Feb. 2002, 3 pages.

Office action for U.S. Appl. No. 12/945,741, mailed on Feb. 13, 2014, Luo, et al., "Compressive Wireless Modulation", 9 pages.

Wikipedia, "Raptor Code", retrieved Apr. 1, 2014 from https://en.wikipedia.org/wiki/Raptor_codes, 3 pgs.

Final Office Action for U.S. Appl. No. 12/945,741, mailed on Aug. 8, 2014, Chong Luo, "Compressive Wireless Modulation," 11 pages.

\* cited by examiner

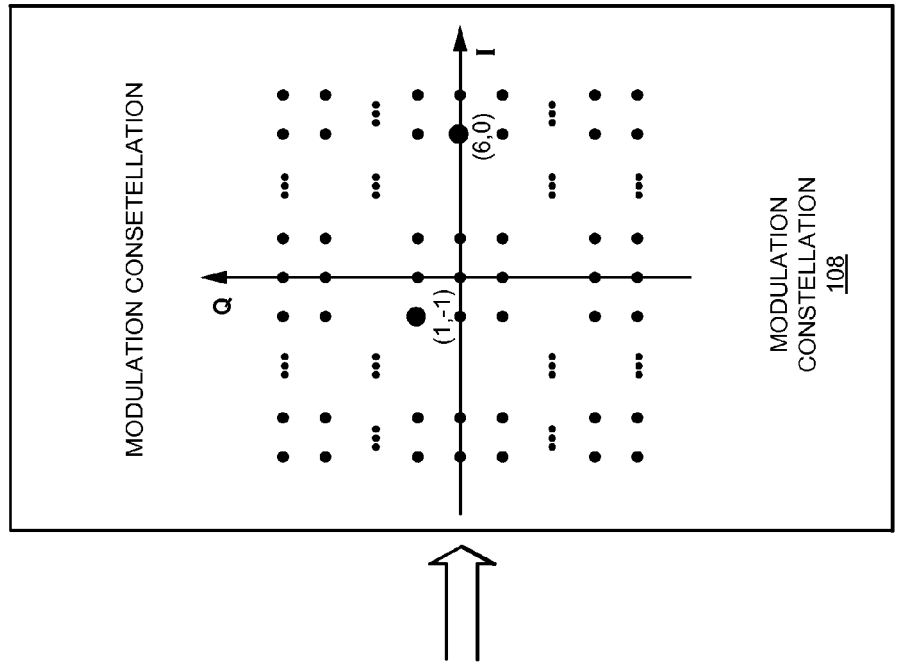
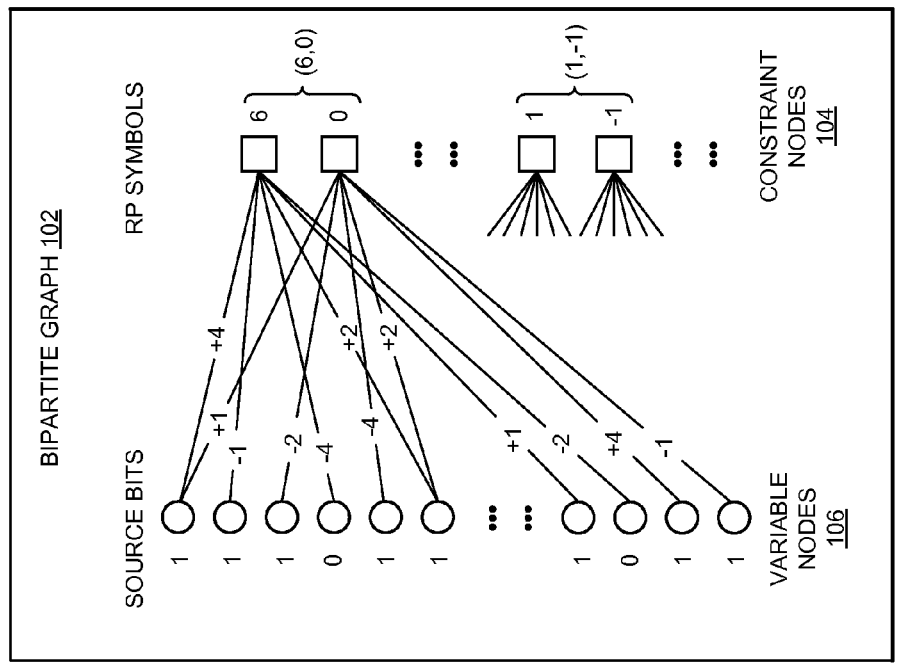
FIG. 1

$M \times N$
LOW-DENSITY MATRIX
202

$N \times 1$
SOURCE BIT VECTOR
204

$$\begin{bmatrix} W_k & \ldots & W_1 & \ldots & 0 & \ldots & W_L \\ 0 & \ldots & W_1 & \ldots & W_L & \ldots & 0 \\ 0 & \ldots & W_1 & \ldots & W_L & \ldots & 0 \\ 0 & \ldots & W_1 & \ldots & W_L & \ldots & 0 \\ 0 & \ldots & W_1 & \ldots & W_L & \ldots & 0 \\ 0 & \ldots & W_1 & \ldots & W_L & \ldots & 0 \\ 0 & \ldots & W_1 & \ldots & W_L & \ldots & 0 \\ 0 & \ldots & W_k & \ldots & W_L & \ldots & W_1 \\ & & & \ldots & & & \\ 0 & \ldots & W_L & \ldots & W_1 & \ldots & W_k \end{bmatrix} \begin{bmatrix} 0 \\ 1 \\ 0 \\ 0 \\ 0 \\ 1 \\ 0 \\ 1 \\ \ldots \\ B_N \end{bmatrix}$$

FIG. 2

| | |
|---|---|
| $w(v,c)$ | The weight on the edge between $v$ and $c$. |
| $\mu_{v \to c}$ | The message sent from $v$ to $c$. |
| $\mu_{c \to v}$ | The message sent from $c$ to $v$. |
| $\rho$ | The a priori probability of bit 1 for all variable nodes. |
| $\rho_v(\cdot)$ | The Probability Density Function (PDF) of variable node $v$. |
| $\rho_c(\cdot)$ | The PDF of constraint node $c$ calculated based on the PDFs of all its neighboring variable nodes. |
| $\rho_{c|v}(\cdot)$ | The PDF of constraint node $c$ calculated based on the PDFs of all its neighboring variable nodes except variable node $v$. |

FAST DECODING BASED ON ZIGZAG DECONVOLUTION FOR RANDOM PROJECTION CODE

BACKGROUND

In digital communication systems, a low density parity-check code (LDPC) is an error correcting code used in noisy communication channels to reduce a probability of a loss of information. LDPC codes are generally represented using a bipartite graph and decoded by an iterative message-passing (MP) algorithm. The MP algorithm iteratively passes messages between variable nodes (e.g., message nodes) and check nodes (e.g., constraint nodes) along connected edges of the bipartite graph. If the messages passed along the edges are probabilities, then the decoding is referred to as belief propagation (BP) decoding.

Compressive sensing (CS), which can be based on a low-density measurement matrix, may also be used for error correction coding. CS is a signal processing technique for reconstructing a signal that takes advantage of a signal's sparseness or compressibility. Using CS, an n-dimensional signal having a sparse or compressible representation can be reconstructed from m linear measurements, even if m<n. As with LDPC, a compressive sensing (CS) system can use belief propagation (BP) decoding. Such a system is referred to herein as a CS-BP system.

The complexity of CS-BP decoding is much higher than LDPC decoding because the constraint nodes of a CS-BP system have to compute convolutions of several probability distribution functions (PDFs). A CS-BP system computes measurements via weighted sum operations, instead of logical exclusive OR (XOR), as used for binary LDPC systems.

A standard processing solution for CS-BP systems is to perform processing in the frequency domain, such as via fast Fourier transform (FFT) and inverse FFT (IFFT). This frequency domain based processing converts convolution to multiplication and deconvolution to division. However, such processing is not efficient for binary-input PDFs.

SUMMARY

This application describes techniques for fast decoding at a receiver for data encoded using a compressive coded modulation (CCM). CCM simultaneously achieves joint source-channel coding and seamless rate adaptation. CCM is based on a random projection (RP) code inspired by compressive sensing (CS) theory, such that generated code may rely on properties of sparseness. The RP code (RPC) resembles low-density parity-check (LDPC) code, in that it can be represented in a receiver by a bipartite graph. However, unlike LDPC, variable nodes (e.g., message nodes) of the bipartite graph are represented by binary source bits and constraint nodes (e.g., check nodes) are represented by received multi-level RP symbols. Hence, RPC can be decoded at a receiver using belief propagation (BP).

The decoding algorithm in the receiver is denoted as a "RPC-BP decoding algorithm" herein, since variable nodes are represented as binary and constraint nodes are represented by multi-level symbols. RPC-BP decoding is performed in the time domain by computing convolutions to generate a probability density function (PDF) for neighboring variable nodes. Performing RPC-BP using convolutions is significantly more efficient (e.g., 20 times faster) than frequency domain (e.g., fast Fourier transform (FFT)) processing, as used in compressive sensing (CS) with belief propagation (BP) (i.e., CS-BP). To further add to the processing efficiency of the decoder, the RPC-BP decoding algorithm may use a ZigZag iteration to perform deconvolutions of variable nodes to facilitate generation of constraint node messages for belief propagation. The ZigZag iteration (i.e., ZigZag deconvolution) can be performed in a bidirectional fashion (e.g., left-to-right or right-to-left) to enhance precision, with a best direction determined by the RPC-BP decoder based on values of variable node probabilities.

As part of RPC-BP decoding, rate adaptation may be seamless, as the number of RP symbols received can be adjusted in fine granularity. As an example, for a current set of binary source bits, a transmitter sends a block of RP symbols to a receiver. Upon successful demodulation and decoding of the current set of binary source bits, the receiver sends an acknowledgment to the transmitter, signaling the transmitter to cease encoding, modulating and transmitting RP symbols for the current set of binary source bits. However, if the receiver does not send an acknowledgment to the transmitter, the transmitter may send several more symbols to the receiver, based on a predetermined granularity, and listen for an acknowledgment. The transmitter may continue the process of sending several more symbols and listening for an acknowledgment from the receiver indicating successful decoding of the current set of binary source bits.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The term "techniques," for instance, may refer to circuitry, hardware logic, device(s), system(s), method(s) and/or computer-readable instructions as permitted by the context above and throughout the document.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 1 is a symbolic diagram of coding applied to an example set of binary input bits for mapping to a modulation constellation for transmission.

FIG. 2 is a symbolic diagram of an example matrix representation of a random projection code to encode input binary source bits using weight values to generate multi-level rate-less symbols.

FIG. 4 defines an example of a set of symbolic notations used in belief propagation (BP) decoding.

DETAILED DESCRIPTION

Figure 3:
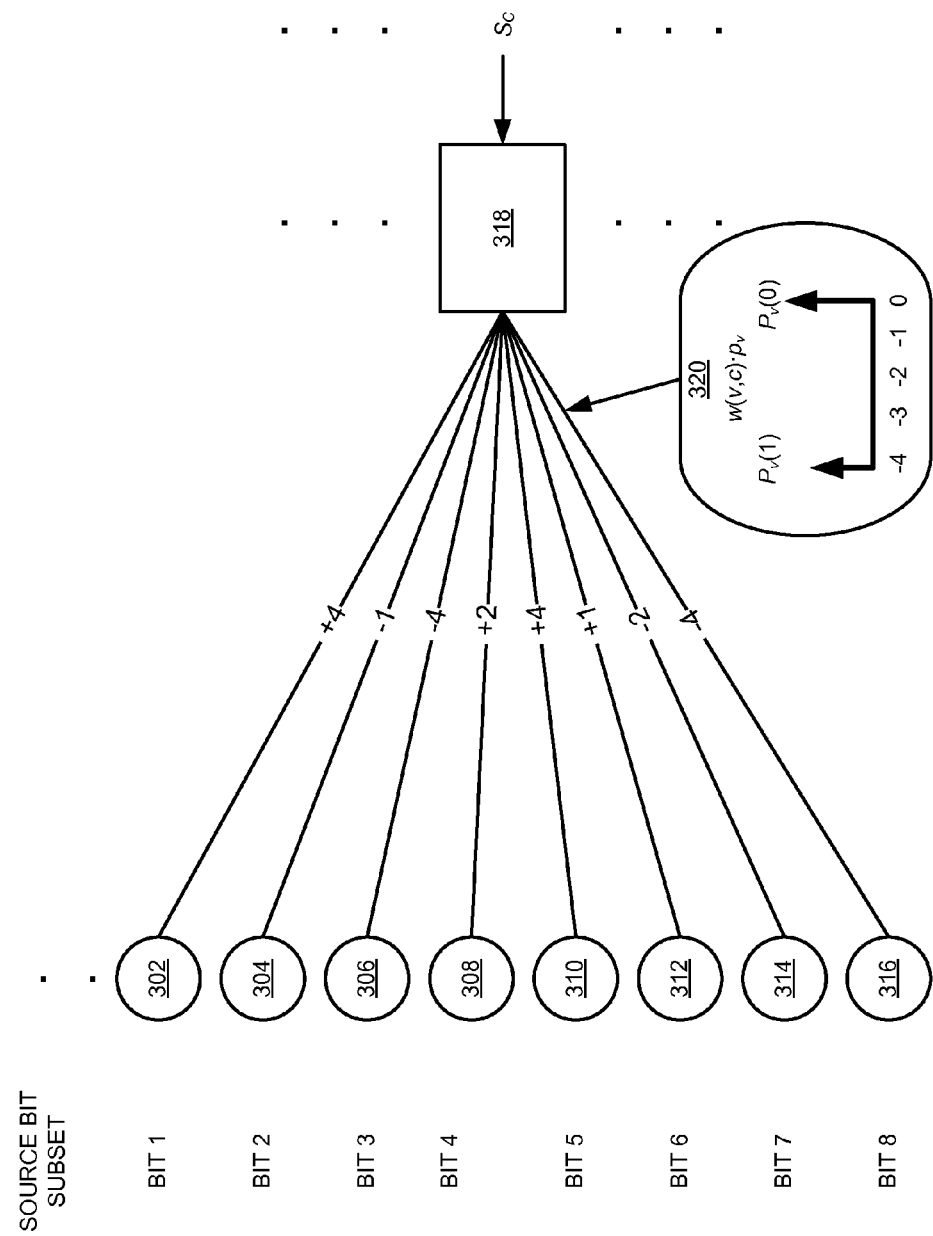
FIG. 3 is a symbolic diagram of an example portion of a bipartite graph representation at a decoder.

As discussed above, existing decoding algorithms are inefficient, as they rely on calculating fast Fourier transforms (FFTs) and inverse FFTs. This application describes decoding techniques that may be used for efficient decoding of a block of multilevel symbols, some or many of which may be corrupted by noise induced by a transmission channel, into a desired block of source bits. The techniques described herein are also suitable for real time decoding of high speed (e.g., ≥1 Gbps) bit streams in a variety of communications devices and systems, such as wireless transceivers, wireless repeaters, wireless routers, cable modems, digital subscriber line (DSL) modems, power-line modems, or the like. The techniques described herein allow such devices to efficiently and effectively decode source bits, for example, in noisy and/or power constrained environments.

FIG. 1 shows an example environment 100 that illustrates a bipartite graph 102 representation used for the construction of random projection (RP) symbols at constraint nodes 104 from binary source bits at variable nodes 106. As an example, source bits at variable nodes 106 may be represented by a binary vector $b=(b_1, b_2, \ldots, b_N) \in \{0,1\}^N$. RP symbols at constraint nodes 104 may be represented by a multi-level vector $s=(s_1, s_2, \ldots, s_M)$. Each of variable nodes 106 can be connected to one or more constraint nodes 104 by various weights (e.g., ±1, ±2, ±4) represented by edges of bipartite graph 102. In various embodiments, the weights are non-zero values selected from a weight multiset W, designed to control or influence, for example, an entropy, free distance, mean and signal to noise ratio (SNR) of received RP symbols. As shown in FIG. 1, each constraint node 104 is connected to six variable nodes 106, but other numbers of connections are within the scope of this disclosure.

As an example of using the bipartite graph to generate RP symbols at constraint nodes 104 from source bits at variable nodes 106, as shown in FIG. 1, the top RP symbol value of 6 is generated by a sum of source bits 1, 1, 0, 1, 1, 0 and edge weights of +4, −1, −4, +2, +1, −2, respectively. The sum yields (1)(4)+(1)(−1)+(0)(−4)+(1)(2)+(1)(1)+(0)(−2)=6. A similar computation of source bits at variable nodes 106 and corresponding edge weights of bipartite graph 102 would yield a sum of 0 for the second from the top of constraint nodes 104.

In the context of example environment 100, generated RP symbols are paired and mapped to a modulation constellation 108, such as the I (i.e., in-phase) and Q (i.e., quadrature-phase) components of a quadrature amplitude modulation (QAM) constellation. As shown in FIG. 1, pairs of RP symbols (6,0) and (1,−1) are generated to create constellation symbols that are mapped to the modulation constellation 108. To facilitate mapping of binary source bits to RP symbols, pairing of RP symbols and mapping RP symbol pairs to modulation constellation 108, RP symbol values of vector s are constrained such that $s_i \in [n_{min}, n_{max}]$. As an example, when the weight set is (±1, ±2, ±4, ±4), $s_i \in [-11, +11]$, resulting in a (23×23) modulation constellation 108. Thus, in this example, edge weights of bipartite graph 102 may be structured such that the sum of source bits with corresponding edge weights would yield a summed value that is ≥−11 and ≤+11. This facilitates using a fixed size modulation constellation 108 for transmission of pairs of RP symbols by a QAM transmitter. Thus, a pair of RP symbols corresponds to a portion of the source bits at variable nodes 106 for transmission by a QAM transmitter.

FIG. 2 illustrates a matrix representation for the generation of RP symbols at constraint nodes 104 from source bits at variable nodes 106 in bipartite graph 102. If M symbols for transmission are stacked to form a symbol vector $s=(s_1, s_2, \ldots, s_M)$, the bit-to-symbol mapping process can be concisely described as $s=G \cdot b$, where G can be represented by M×N low-density matrix 202 (e.g., a low-density measurement matrix), and b can be represented by N×1 source bit vector 204. As an example, low-density matrix 202 may be structured such that there are only L (e.g. L=8) non-zero values on each row (i.e. low-density). Thus, G can be constructed with M rows, each with N values, where values in each row are all zeros, except for the weight values.

Thus, only L entries in each row of G, $g_m$ (m=1, 2, ..., N) are non-zero, and the L entries can take values of $W_i$ from a weight multiset W which includes various permutations of $\{W_1, W_2, \ldots, W_L\}$ that can be interspersed with zero values. FIG. 2 illustrates a simple example of permutations of the weight multiset W such that 1<k<L. The weight values are distributed in the rows of the matrix such that multiplying the M×N matrix by the N×1 vector generates M symbols, each based on a different weighted combination of L source weights distributed with zero values of each row. Both the order and the position of the L weight values distributed with zero values in the rows of G can vary from one row to another. Thus, numerous permutations exist for the distribution of L weight values into rows of matrix 202. Thus, low-density matrix 202 can define, at least in part, the connectivity structure between constraint nodes 104 and variable nodes 106 in bipartite graph 102. In various embodiments, M may equal N or M may be less than or more than N. Low-density matrix 202 may be stacked onto one or more sub-matrices, effectively increasing the value of M, such that additional RP symbols may be generated.

In an example implementation, the source bits to be transmitted are divided into frames, with each frame having a length denoted by N. Depending on the specific implementation, a frame may have a length of, for example, 100, 400, 500, etc. As illustrated in FIG. 2, the source bits $(b_1, b_2, \ldots, b_N)$ for a particular frame are arranged as a column to form an N×1 source matrix 204.

Source bit vector 204 to RP symbol mapping can be repeated an arbitrary number of times. A sender may keep generating and transmitting RP symbols until the receiver successfully decodes the source bits and returns an acknowledgement to the sender. If this happens after M RP symbols (M/2 constellation symbols) are transmitted, then the transmission rate will be:

$$R = \frac{2N}{M} \quad (1)$$

Different values of M correspond to different transmission rates. As M can be adjusted at a very fine granularity, smooth rate adaptation can be achieved.

The achievable transmission rate is generally a function of source data sparsity, transmission channel conditions and RP code design. Ideally, there is an optimal code (e.g., weight multiset W and/or configuration of low-density matrix 202) for each source sparsity and channel condition. However, CCM can provide for "blind" rate adaptation (i.e. the channel condition is not known to the sender). Therefore, as part of RP code design, weights are selected which achieve an overall high throughput for the primary SNR range of wired or wireless communication channels.

According to CS theory, the number of RP symbols required for successful decoding of source bit vector 204 decreases as source bit vector 204 sparsity and/or redundancy increases, as well as when channel quality increases. Therefore, a source bit vector 204 with higher sparsity and/or redundancy can be decoded from a smaller number of RP symbols, which results in a higher transmission rate. In contrast, more RP symbols need to be transmitted when channel conditions worsen, which results in a lower transmission rate. Thus, if source bit vector 204 is sparse, then the probability of 1's occurring is p, such that p<0.5. The number of RP symbols required to decode source bit vector 204 is generally proportional to the sparsity p. Therefore, the transmission rate for sparse source (i.e., p<0.5), as defined in eq. (1), will be higher than for non-sparse source (i.e., p=0.5). By way of example and not limitation, simple bit flipping can be used for bit streams where p>0.5.

Thus, compression gain can be achieved when source bit vector 204 is sparse. As an example, sparsity of source bit vector 204 may be determined, and an appropriate weight set may be selected from weight multiset W. To facilitate digital transmission of RP symbols, weight sets are designed such that RP symbols have a fixed mean (e.g., zero mean) regardless of source bit sparsity p. Also, CCM is designed with a large free distance between codewords (e.g., vectors of RP symbols) such that a sequence of transmitted symbols is robust against channel noise.

Additionally, CCM incorporates a rate adaptation scheme, such that transmission could stop, such as via receipt of an acknowledgement from a receiver, at any time before all M symbols generated by matrix G are transmitted. Therefore, if decoding in a receiver is successful after a first K symbols are transmitted, the actual encoding matrix used is $G_K$, which is also designed to create a large free distance for all K symbols.

Thus, RP symbols are transmitted to a receiver. A receiver obtains noisy versions of the transmitted symbols. Let $\hat{s}$ denote the vector of the received symbols, then we have $\hat{s}=G \cdot b+e$, where e is the error vector.

In an additive white Gaussian noise (AWGN) channel, e may be comprised of Gaussian noises. In a fading channel with fading parameter h, each element in e may be $n_i/h_i$ where $n_i$ and $h_i$ are the noise level and fading parameter for the $i^{th}$ symbol.

Decoding is equivalent to finding the bit vector with the maximum a posteriori (MAP) probability. It is an inference problem which can be formalized as:

$$\hat{b} = \arg \max P(b|\hat{s})$$
$$b \in \{0,1\}^N$$
$$\text{such that: } \hat{s}=Gb+e \qquad (2)$$

Example Belief Propagation Decoding

The RP code (RPC) can be represented by a bipartite graph, where source bits are represented as variable nodes connected by weighted edges to constraint nodes that represent multi-level RP symbols received at a receiver. Hence, RPC can be decoded using belief propagation (BP). However, since RP symbols are generated by arithmetic addition rather than logical XOR as commonly used for LDPC, the belief computation at constraint nodes can be much more complex relative to LDPC decoding. The complexity of CS-BP decoding is also higher than LDPC decoding, as CS-BP decoding uses fast Fourier transform (FFT) processing. Techniques are described herein for reducing the computational complexity of the decoding algorithm for the CCM scheme relative to other common decoding schemes.

For binary variable nodes and multi-level constraint nodes, the belief computation at constraint nodes is more efficiently accomplished by direct convolution rather than the fast Fourier transform (FFT), as used in CS-BP decoding. For each constraint node, the convolution of the distributions for all neighboring variable nodes is computed to generate a probability distribution function (PDF), and then the PDF is reused for all outgoing messages from a constraint node to its neighboring (e.g., connected) variable nodes. This is performed by deconvolving the PDF of the variable node being processed to generate a partial probability distribution function for each of the neighboring variable nodes. To save computational cost, the zero multiplication in the convolution can be avoided. In addition, a ZigZag iteration is used to perform the deconvolution for each neighboring variable node of a given constraint node in the bipartite graph. Utilizing convolutions and ZigZag deconvolutions as part of the iterative belief propagation decoding algorithm in RPC-BP is computationally more efficient than decoding techniques used in the CS-BP algorithm.

Example RPC-BP Decoding Algorithm

A decoder in a receiver can be configured to use a bipartite graph representation to decode N source bits (e.g., source bit vector 204) from $M_O$ noisy received RP symbols. As an example, $M_O$ may be less than or equal to N. In the bipartite graph representation in the receiver, each of the N source bits can be associated with, or represented by, a variable node. Additionally, and each of the $M_O$ noisy received RP symbols can be associated with, or represented by, a constraint node. Therefore, in various embodiments, an initial bipartite graph representation has N binary variable nodes and $M_O$ multi-valued constraint nodes. Messages associated with probabilities (e.g., beliefs, likelihoods) of variable nodes representing 0 or 1 are passed between variable nodes and constraint nodes as part of an iterative belief propagation algorithm. If a receiver successfully decodes the N bits from the received noisy $M_O$ multi-valued RP symbols, the receiver sends an acknowledgement to the transmitter. If the transmitter does not receive an acknowledgement, the transmitter will send additional RP symbols which are associated with, or represented by, additional constraint nodes in the receiver. This process continues until the receiver believes (e.g., probabilistically determines) that the N source bits are successfully decoded.

FIG. 3 illustrates a portion of a bipartite graph representation that may be utilized by a decoder in a receiver. FIG. 3 shows eight variable nodes 302-316 each associated with eight binary bits (e.g., bits 1-8) of a portion of a source bit vector (e.g., source bit vector 204). Eight variable nodes are selected for illustrative purposes, as other numbers of variable nodes may be used. Variable nodes 302-316 are shown connected to constraint node 318, via edges with weights shown from top to bottom as +4, −1, −4, +2, +4, +1, −2 and −4. FIG. 3 illustrates that variable nodes 302-316 are connected to a single constraint node 318 for illustrative purposes only, as variable nodes may connect to multiple constraint nodes. The terms "variable" and "constraint" nodes connected by weighted edges are used for purposes of discussion, as either node can be viewed as a processing node, a node representation, an abstraction of a node and/or a processed node. Thus, such nodes may perform processing, be externally processed, represent an abstract processing structure, or combinations thereof.

Thus, for purposes of discussion, FIG. 3 illustrates a portion of an example bipartite graph representation where 8 desired bit values of a portion of a source bit vector are associated with 8 variable nodes 302-316. Thus, variable nodes 302-316 and constraint node 318 are but a small portion of nodes that make up a bipartite graph representation used for purposes of describing a decoding process performed by a decoder at a receiver, where many source bits are each associated with a corresponding variable node and many received symbols are each associated with a corresponding constraint node. Constraint node 318 is shown associated with a received symbol $S_c$, received by a receiver in the presence of noise.

Let v denote a particular variable node, such as one of variable nodes 302-316, and let c denote a constraint node, such as constraint node 318. FIG. 4 illustrates some notations used to describe the following illustrative operations of an RPC-BP decoding algorithm.

Operation 1) Initialization: Initialize messages from variable nodes to constraint nodes with a priori probability p.

$$\mu_{v \to c} = p_v(1) = p \quad (3)$$

The variable p represents an initial probability that variable node v is 1. As an example, if an N-length source bit vector is known to be random, p can be initially set to 0.5. Alternatively, a transmitter can scan a source bit vector, and determine a probability of a 1 occurring in the source bit vector, and provide this information to a decoding receiver. As examples, the source bit vector can be sparse or random, such that p may take on different values (e.g., 0.1, 0.15, 0.25, 0.5, etc.) for different source bit vectors. In various embodiments, a transmitter and decoding receiver pair may select different low-density matrices 202 based on a determined value of p, or ranges of p, as well as a previously determined, or estimated noise level and/or a signal-to-noise ratio (SNR) on an associated transmission channel. Borrowing terminology from CS theory, for sparse source bit vectors, p may be referred to as the source sparsity, or alternatively, N-length source bit vectors may be referred to asp-sparse.

Operation 2) Computation at constraint nodes: For each constraint node c, compute a probability distribution function $p_c(\cdot)$ according to the incoming messages from all neighboring (e.g., connected) variable nodes v via convolution as shown in eq. (4). For each neighboring variable node v (e.g., v∈n(c)) of an associated constraint node c, compute $p_{c \backslash v}(\cdot)$ via deconvolution as shown in eq. (5):

$$p_c = (*)_{v \in n(c)} (w(c,v) \cdot p_v) \quad (4)$$

$$p_{c \backslash v} = p_c * (w(c,v) \cdot p_v) \quad (5)$$

As an example, w(c,v) corresponds to the weights between variable nodes 302-316 and constraint node 318 in FIG. 3. (Note that w(c,v)=w(v,c)). In eq. (4) above, v∈n(c) implies that $p_c$ is calculated for each neighboring variable node v that is connected to a corresponding constraint node c via a weighted edge. Thus, $p_c$ can be viewed as a PDF that includes a PDF contribution for each neighboring variable node v of a constraint node c.

In the example environment illustrated in FIG. 3, each of variable nodes 302-316 associated with bits 1-8 are used to calculate $p_c$ at constraint node 318. Thus, in the convolution of eq. (4), each variable node 302-316 contributes a convolution of its PDF to $p_c$. As an example, assume that the probability that a bit is equal to "1" is $P_v(1)=0.3$. Therefore, the probability that a bit is equal to "0" is $1-P_v(1)=0.7=P_v(0)$. Thus, under these initial assumptions, as shown in FIG. 3, in the calculation of $p_c$ in eq. (4), variable node 316 would contribute PDF 320 (i.e., $w(v,c) \cdot p_v$) in the convolution with values at 0 and −4, associated with $P_v(0)$ and $P_v(1)$, respectively.

In eq. (5), the deconvolution $p_{c \backslash v}$ can be viewed as a partial PDF that excludes a convolved contribution of an associated variable node v from $p_c$. Thus, as an example, for the deconvolution $p_{c \backslash v}$ where v is variable node 316, $p_{c \backslash v}$ can be viewed as a partial PDF that excludes the convolution of PDF 320 from $p_c$.

Then, at the corresponding constraint node c, compute $p_v(0)$ and $p_v(1)$ based on the associated partial PDF of node v, the noise probability distribution function (PDF) $p_e$ and the received symbol value $s_c$ associated with constraint node c as:

$$p_v(0) = \sum_i p_{c \backslash v}(i) \cdot p_e(s_c - i) \quad (6)$$

$$p_v(1) = \sum_i p_{c \backslash v}(i) \cdot p_e(s_c - i - w(c,v)) \quad (7)$$

The PDF $p_e$ can be determined or estimated by numerous techniques. As an example, a communication system can transmit known pilot symbols, where an additive white Gaussian noise (AWGN) channel is assumed, allowing for $p_e$ to be determined or estimated.

Then, compute the constraint node message for node v as $\mu_{c \to v}$, via normalization, as:

$$\mu_{c \to v} = \frac{p_v(1)}{p_v(0) + p_v(1)} \quad (8)$$

Operation 3) Computation at variable nodes: For each variable node v, compute $p_v(0)$ and $p_v(1)$ via multiplication:

$$p_v(0) = (1-p) \prod_{c \in n(v)} (1 - \mu_{c \to v}) \quad (9)$$

$$p_v(1) = p \prod_{c \in n(v)} \mu_{c \to v} \quad (10)$$

Then for each neighboring constraint node c∈n(v), compute $\mu_{v \to c}$ division and normalization, as:

$$\mu_{v \to c} = \frac{p_v(1)/\mu_{c \to v}}{p_v(0)/(1 - \mu_{c \to v}) + p_v(1)/\mu_{c \to v}} \quad (11)$$

Repeat operations 2 and 3 until convergence is determined, or a maximum iteration time or maximum number of iterations are reached. As an example, a maximum number of iterations can be set to 15, beyond which the any performance gain is marginal.

Operation 4) Output: For each variable node v, compute $p_v(0)$ and $p_v(1)$ according to eq. (9 and/or 10), and output the estimated bit value via hard decision.

A primary difference between this RPC-BP decoding algorithm and the CS-BP decoding algorithm lies in the computation at the constraint nodes (operation 2). In various embodiments, variable nodes and the noise node are processed in separate operations, because the former is binary and the latter is continuously valued. A ZigZag deconvolution is described below that greatly simplifies the computation of $p_{c \backslash v}$ in eq. (5), resulting in reduced computational complexity.

Figure 5:
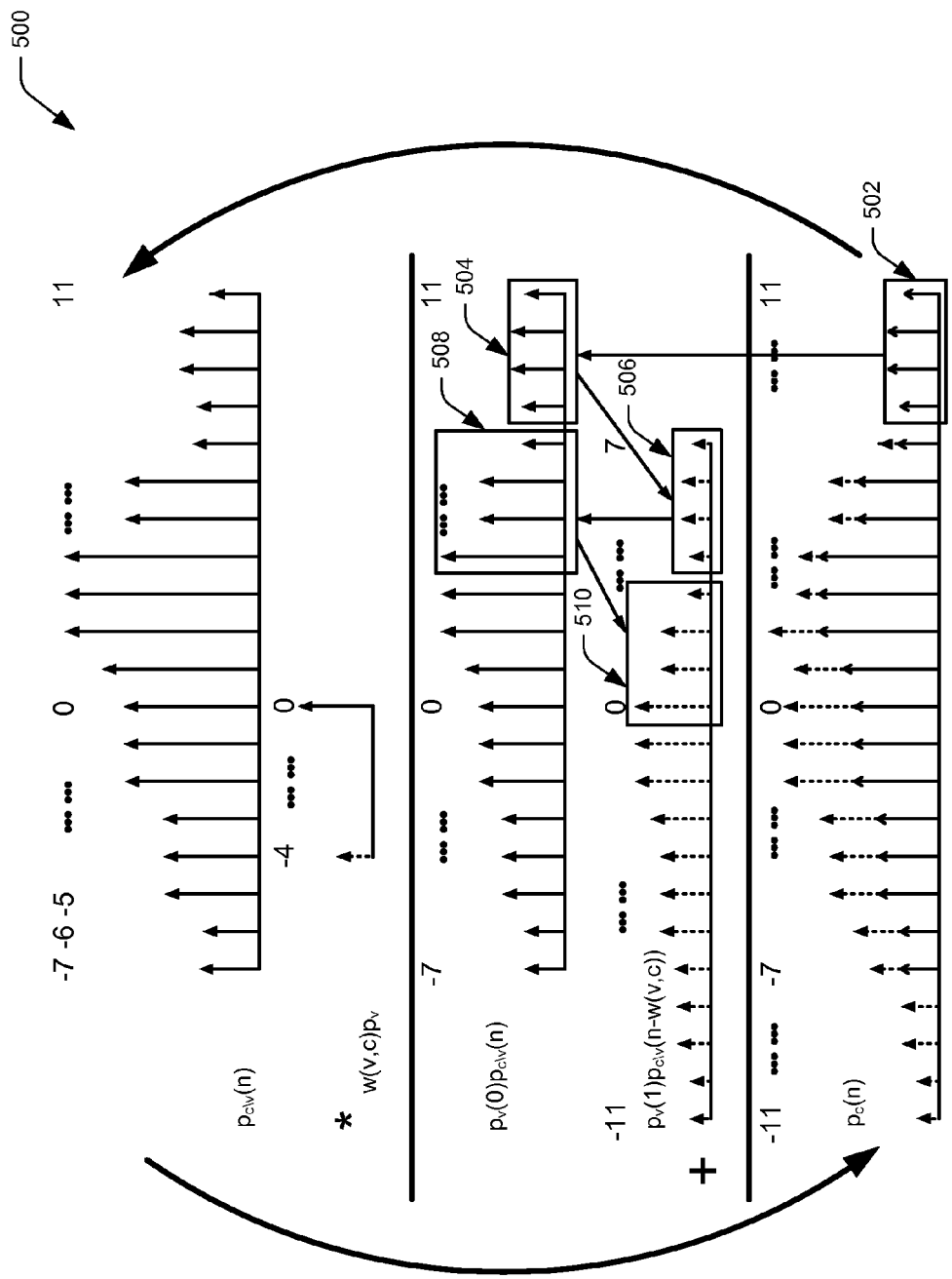
FIG. 5 is a symbolic diagram illustrating example convolution and ZigZag deconvolution performed by a decoder.

FIG. 5 illustrates an example environment 500 that depicts the convolution by shift addition as well as ZigZag deconvolution. The convolution flow is shown from top to bottom. The top row depicts $p_{c \backslash v}(n)$. As an example, in $p_{c \backslash v}(n)$, let v=variable node 316 in FIG. 3 (e.g., prior to the convolution of the 8$^{th}$ bit). Thus, in this example, the top row represents the convolution of variable nodes 302-314, corresponding to bits 1-7 in FIG. 3, excluding variable node v (e.g., variable node 316, the 8$^{th}$ bit). The second row represents $w(v,c) \cdot p_v$, such as PDF 320 associated with variable node 316 in FIG. 3. In this example, the weight between variable node v (e.g., variable node 316) and constraint node c (e.g., constraint node 318) is $w(v,c)=-4$. Hence, the PDF of $w(v,c) \cdot p_v$ only has two spikes at −4 and 0, corresponding to $p_v(1)$ and $p_v(0)$, respectively. The convolution of $w(v,c) \cdot p_v$ and any PDF $p_{c'}$ (including but not limited to $p_{c \backslash v}$) can be computed by:

$$(p_c * w(v,c) \cdot p_v)(n) = p_v(0) \cdot p_c(n) + p_v(1) \cdot p_c(n - w(v,c)) \quad (12)$$

Thus, the third row in FIG. 5, $p_v(0) p_{c \backslash v}(n)$, is the convolution of the top row and the spike at 0 in the second row, corresponding to the probability that the 8$^{th}$ bit is zero, using the example of FIG. 3. The values in the third row are shown as solid lines. The fourth row is $p_v(1) p_{c \backslash v}(n - w(v,c))$ for $w(v,c)=-4$, which is the convolution of the top row and the spike at −4 in the second row, corresponding to the probability that the 8$^{th}$ bit is one, using the example of FIG. 3. The values in the fourth row are shown as dashed lines.

The addition in eq. (12) is shown in the middle of the FIG. 5, as the addition of the third row and the fourth row to generate the bottom row, $p_c(n)$, of eq. (4). The bottom row illustrates the addition of the constituent components of the third and fourth rows, shown as corresponding solid and dashed line constituent components of the addition. Note that the four components on the right (in rectangle 502) of $p_c(n)$ contain only constituent components from the third row (e.g., only solid lines). Thus, dividing these components in rectangle 502 by $p_v(0)$ yields the corresponding components in $p_{c \backslash v}(n)$ in the top row. Likewise, the four components on the left of $p_c(n)$ contain only constituent components from the third row (e.g., only dashed lines). Dividing these components by $p_v(1)$ and shifting them by 4 yields the corresponding components in $p_{c \backslash v}(n)$ in the top row.

The deconvolution flow is shown from bottom to top in FIG. 5, in which the rectangles 502-510 highlight a ZigZag deconvolution process. In FIG. 5, the ZigZag deconvolution is demonstrated from right to left. However, the ZigZag deconvolution process can be performed in both directions (i.e., right to left or left to right). The practical direction to perform the ZigZag deconvolution can be determined by the values of $p_v(0)$ and $p_v(1)$. For example, when $p_v(0) > p_v(1)$, the deconvolution of a selected variable node v (e.g., a selected bit) from $p_c(n)$ may be computed by:

$$p_{c \backslash v}(n) = \frac{p_c(n) - (p_{c \backslash v}(n - w(v, c))) \cdot p_v(1)}{p_v(0)} \quad (13)$$

When $p_v(0) \leq p_v(1)$, the deconvolution of a selected variable node v may be computed by:

$$p_{c \backslash v}(n) = \frac{p_{c \backslash v}(n + w(v, c)) \cdot p_v(0) - p_c(n + w(v, c))}{p_v(1)} \quad (14)$$

Let $n_{min}$ and $n_{max}$ be the minimum and the maximum value of constraint node c, respectively. As an example, referring back to FIG. 3, a bit sequence of (1, 0, 0, 1, 1, 1, 0, 0) associated with bits 1-8 of variable nodes 302-316 would yield a sum $n_{max}=+11$ at constraint node 318. Conversely, a bit sequence of (0, 1, 1, 0, 0, 0, 1, 1) would yield a sum for $n_{min}=-11$. FIG. 5 illustrates $n_{max}=+11$ and $n_{min}=-11$. Thus, for $n \notin [n_{min}, n_{max}]$, $p_{c \backslash v}(n)=0$. Therefore, by simple recursion, the ZigZag deconvolution process can be performed to deconvolve a selected variable node v from $p_c(n)$ by using selected values from $p_c(n)$. Moreover, the ZigZag deconvolution process can be performed in a bidirectional manner (e.g., left-to-right or right-to-left) using selected values at or near the left or the right side of $p_c(n)$.

As shown in FIG. 5, assuming $p_v(0) > p_v(1)$, and row 2 corresponds to the last variable node to be convolved to generate $p_c(n)$, since $w(v,c)=-4$, eq. (13) becomes:

$$p_{c \backslash v}(n) = \frac{p_c(n) - (p_{c \backslash v}(n + 4)) p_v(1)}{p_v(0)} \quad (15)$$

For n=8, 9, 10 and 11 in $p_c(n)$, the values in rectangle 502 are the same as the values in rectangle 504. Therefore, as discussed previously, for n=8, 9, 10 and 11, the values for $p_{c \backslash v}(n)$ can be determined simply by calculating $p_c(n)/p_v(0)$. Since for $n \notin [n_{min}, n_{max}]$, $p_{c \backslash v}(n)=0$ for n>11 in eq. 14.

For n=4, 5, 6 and 7, the values in rectangle 506 are simply the values in rectangle 504 multiplied by $p_v(1)/p_v(0)$. Therefore, the values in rectangle 508 can be determined by simply subtracting the values in rectangle 506 from corresponding values in $p_c(n)$ at n=4, 5, 6 and 7. The values in rectangle 508 can then be divided by $p_v(0)$ to obtain corresponding values of $p_{c \backslash v}(n)$ at n=4, 5, 6 and 7. As shown above in eq. 14, for n=4, 5, 6 and 7, $p_{c \backslash v}(n) = (p_c(n) - p_{c \backslash v}(n+4) p_v(0))/p_v(1)$. The corresponding values of $p_{c \backslash v}(n)$ were previously determined in the previous operation of the ZigZag deconvolution process.

Similarly, for n=0, 1, 2 and 3, the values in rectangle 510 are simply the values in rectangle 508 multiplied by $p_v(1)/p_v(0)$. The corresponding values of $p_{c \backslash v}(n)$ can be determined by calculating a difference between values in $p_c(n)$ at n=0, 1, 2 and 3 and corresponding values in rectangle 510, and dividing the difference by $p_v(0)$. This ZigZag deconvolution process can be continued until $p_{c \backslash v}(n)$ is determined from $p_c(n)$ by simple scaling, shifting and subtraction operations. Thus, $p_{c \backslash v}(n)$ is determined from $p_c(n)$ by selecting one or more values of $p_c(n)$, that when divided by a variable node probability (e.g., $p_v(0)$ or $p_v(1)$), equal corresponding values of $p_{c \backslash v}(n)$. Then scaling those values by a ratio of variable node probabilities, shifting the scaled values by an associated variable node weight, calculating a difference between the scaled, shifted values and corresponding values of $p_c(n)$, and scaling the difference values to create corresponding values of $p_{c \backslash v}(n)$. Using this simple process, a deconvolution is easily calculated at c for each neighboring variable node v.

Regarding both CS-BP and RPC-BP, most of the computation is taken by computing constraint node messages. As shown in Table 1, the computation cost of CS-BP is around 20 times that for RPC-BP in terms of the number of multiplications (×) and additions (+) for various weight sets W.

TABLE 1

Complexity comparison between RPC-BP and CS-BP

| W | RPC-BP | | CS-BP | |
|---|---|---|---|---|
| | × | + | × | + |
| ±(1244) | 492 | 246 | 8192 | 9216 |
| ±1(111244) | 856 | 428 | 12288 | 13824 |
| ±(111222) | 640 | 320 | 12288 | 13824 |
| ±(11111122) | 954 | 477 | 16384 | 18432 |

Example Environment

Figure 6:
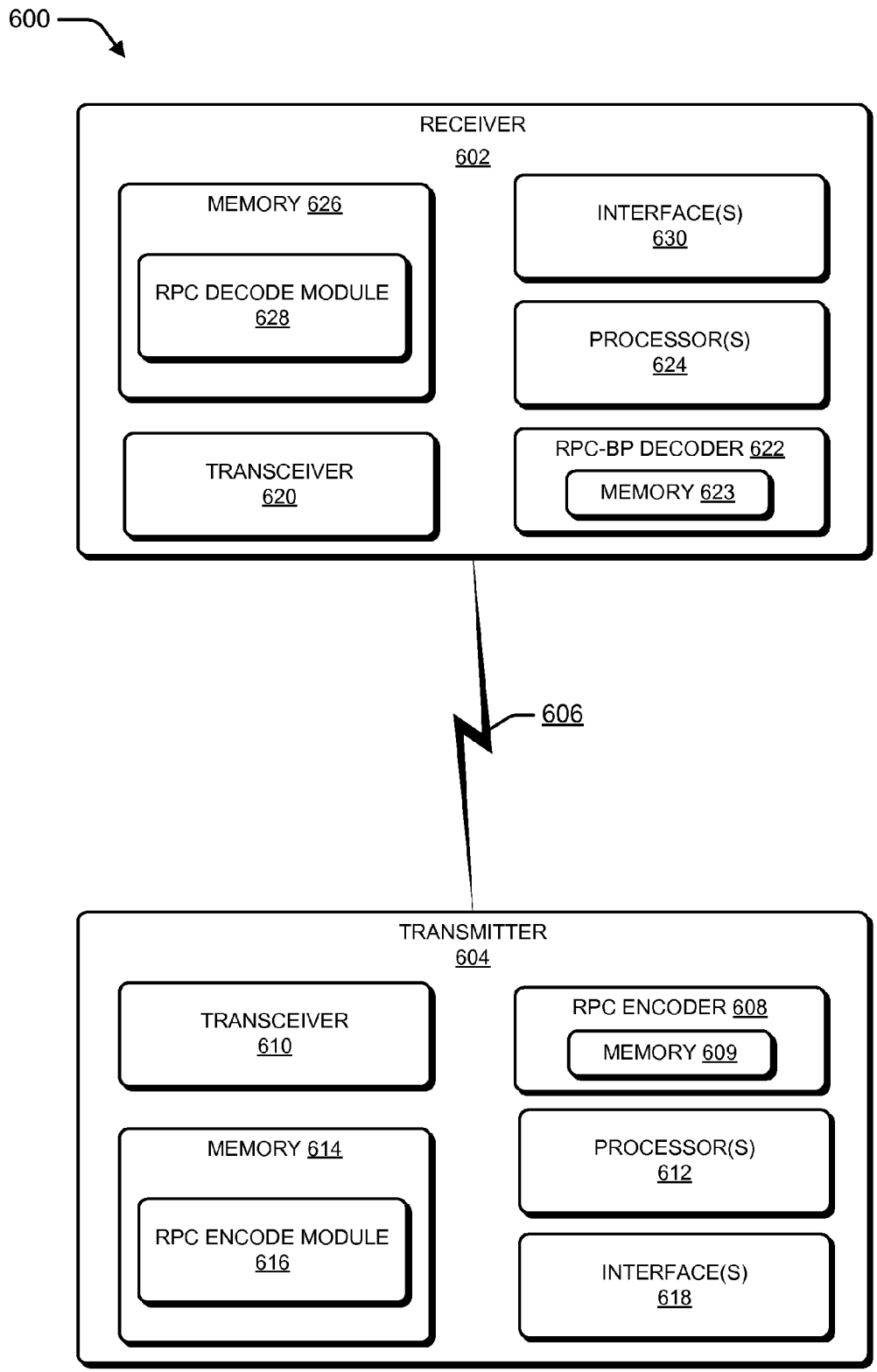
FIG. 6 illustrates an example environment of a transmitter and receiver used for RPC-BP decoding.

FIG. 6 illustrates an example environment 600 usable to implement RPC-BP decoding. Example environment 600 includes a receiver 602 for receiving RP symbols and a transmitter 604 for transmitting RP symbols via channel 606. Channel 606 may include a wired channel (e.g., twisted pair, coax cable, fiber optics, power line, etc.) or a wireless channel (e.g., radio frequency (RF) link, IEEE 802.11x, 4G LTE, etc.). Thus, channel 606 may include a part of a network (e.g., wireless network) as well as any media suitable for the transport of modulated communications. Channel 606 may also include a noisy channel, such that signals that contain RP symbols received by receiver 602 may be corrupted by noise, fading, non-linear group delay, other interferences, or the like.

Receiver 602 and transmitter 604 may be implemented in many forms. In various embodiments, receiver 602 and transmitter 604 are configured for real time communications of high speed data (e.g., 1 Gbps) using RPC encoding and RPC-BP decoding over a noisy channel 606.

Transmitter 604 includes an RPC encoder 608 for mapping source bits to RP symbols for transmission of RP symbols to receiver 602 using transceiver 610. The RPC encoder 608 may be implemented in hardware, firmware, and/or software. In various embodiments, RPC encoder may be implemented by a processing unit including hardware control circuitry, hardware logic, one or more digital signal processors (DSPs), one or more application specific integrated circuits (ASICs), one or more field programmable gate arrays (FPGAs), one or more central processing units (CPUs), one or more graphics processing units (GPUs), memory 609, and/or the like, for performing source bit frame to RP symbol mapping, in addition to RP symbol pairing. RPC encoder 608 may directly connect to transceiver 610 for transmission of RP symbols. RPC encoder 608 may be configured to process acknowledgements from receiver 602 to stop transmission of RP symbols upon receipt of an acknowledgement, and/or to transmit subsequent blocks of RP symbols when an acknowledgement is not received after a specified waiting period. Transmitter 604 may also include one or more processors 612. Processors 612 may comprise electronic circuitry, logic, processing cores, or the like, for processing executable instructions in internal processor memory (not shown) as well as external memory 614. Memory 614 may contain various modules, such as RPC encode module 616. In some examples, the RPC encode module 616 may entirely replace the RPC encoder 608. In other examples, the RPC encode module 616 may be in addition to the RPC encoder 608 and may, for example, contain instructions to facilitate the operation of RPC encoder 608. In various embodiments, RPC encode module 616 may perform some or all of the operations described for RPC encoder 608.

In various embodiments, RP symbols are paired and mapped to a modulation constellation, as illustrated in FIG. 1. Therefore, transceiver 610 may be configured to modulate and transmit symbols using a modulation constellation, such as QAM. Additionally, transceiver 610 may be configured to transmit modulated RP symbols using various forms of modulation that incorporate modulation constellations like QAM, such as orthogonal frequency-division multiplexing (OFDM), or the like. Transceiver 610 may be configured to receive acknowledgements from receiver 602. Interfaces 618 may be used to facilitate communications with devices or components embedded with, or external to, transmitter 604, that may include sources of data to be transmitted.

Receiver 602 includes transceiver 620 for receiving RP symbols transmitted by transmitter 604 via channel 606. When a signal transmitted by transmitter 604 is a modulated signal, transceiver 620 is configured to demodulate the transmitted signal, and provide at least estimates of the RP symbols to RPC-BP decoder 622. Thus, transceiver 620 demodulates a received signal, resulting in received symbols, some of which may be different from the transmitted symbols due to noise introduced in channel 606. RPC-BP decoder 622 may be configured to implement RPC-BP decoding as described herein. Thus, RPC-BP decoder 622 accumulates the demodulated symbols until a threshold number of symbols have been received, and/or until transmitter 604 stops transmitting symbols. The threshold number may be set based on a likelihood that the number of symbols will include enough data to enable successful decoding of the symbols, resulting in the original binary information bits.

The RPC decoder 622 may be implemented in hardware, firmware, and/or software. In various embodiments, RPC-BP decoder 622 may be a processing unit that may include hardware circuitry, hardware logic, one or more digital signal processors DSPs, one or more application specific integrated circuits (ASICs), one or more field programmable gate arrays (FPGAs), one or more central processing units (CPUs), one or more graphics processing unit (GPUs), memory 623, and/or the like, for performing RPC-BP decoding operations in real time for high speed data decoding.

Thus, in various embodiments, RPC-BP decoder 622 performs all or most of the RPC-BP decoding operations described herein (e.g., operations 1-4), such as initialization of variable nodes, iterative computations at constraint nodes and variable nodes, and output of estimated bit values via hard decisions. Thus, RPC-BP decoder 622 processes a block of $M_0$ noisy RP symbols, to attempt to decode a frame of N source bits. If RPC-BP decoder 622 is successful, receiver 602 sends an acknowledgement to transmitter 604 via transceiver 620. If RPC-BP decoder 622 is not successful, RPC-BP decoder 622 will receive additional RP symbols, such as K symbols, from transmitter 604, and perform RPC-BP decoding operations on the $M_0+K$ symbols. As an example, $K \ll M_0$, which provides for seamless rate adaptation. This process may continue until RPC-BP decoder 622 successfully decodes the frame of N source bits, where receiver 602 then sends an acknowledgement to transmitter 604.

Receiver 602 may also include one or more processors 624. Processors 624 may comprise electronic circuitry, hardware logic, processing cores, cache memory (not shown), or the like, for processing executable instructions in internal processor memory as well as external memory 626. Memory 626 may contain various modules, such as RPC decode module 628. RPC decode module 628 may contain instructions, for execution by processor(s) 624, to facilitate the operation of RPC-BP decoder 622. In various embodiments, RPC decode module 628 may perform some or all of the operations described for RPC-BP decoder 622. Interfaces 630 may be used to facilitate communications with devices or components embedded with, or external to, receiver 602.

Although receiver 602 and transmitter 604 are described herein as separate entities, components of transmitter 604 may be incorporated with or shared with components of receiver 602, and visa-versa, to facilitate bidirectional communications between devices.

Receiver 602, as well as transmitter 604 may include and/or interface with, computer-readable media. Computer-readable media includes, at least, two types of computer-readable media, namely computer storage media and communications media.

Computer storage media includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory, cache memory or other memory in RPC-BP decoder 622, or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device.

In contrast, communication media may embody computer readable instructions, data structures, program modules, or other data in a modulated data signal, such as a carrier wave, or other transmission mechanism. As defined herein, computer storage media does not include communication media.

Example Methods

Figure 7:
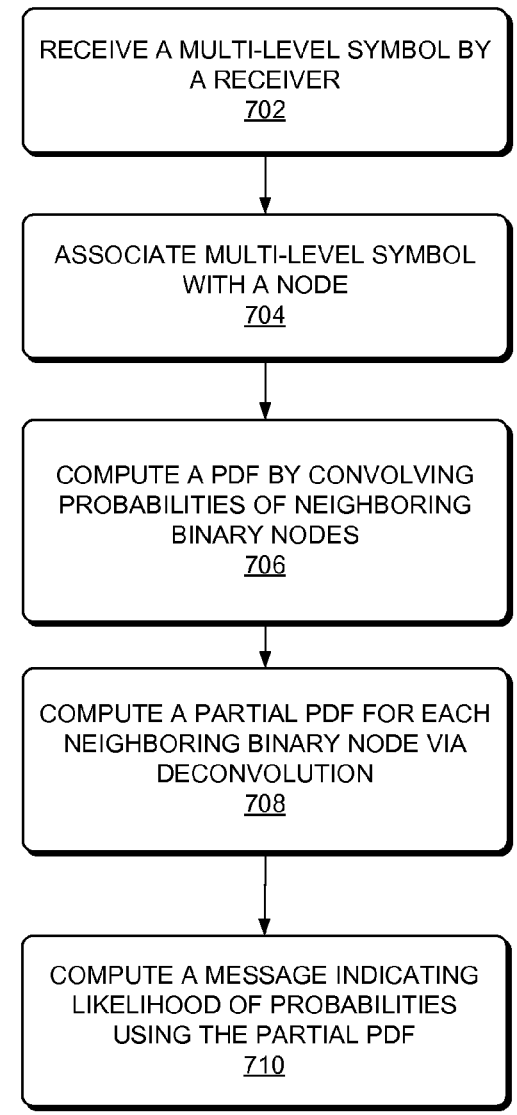
FIG. 7 illustrates example methods of RPC-BP decoding.

FIG. 7 is a flow diagram of an example process performed at a receiver, such as receiver 602. This process is illustrated as a collection of blocks in a logical flow graph, which represents a sequence of operations that can be implemented in hardware, software, or a combination thereof. In the context of software, the blocks represent computer-executable instructions stored on one or more computer storage media that, when executed by one or more processors, cause the processors to perform the recited operations. In the context of hardware, the blocks represent operations performed by control circuitry with or without the assistance of firmware or software. Note that the order in which the process is described is not a limitation, and any number of the described process blocks can be combined in any order to implement the process, or alternate processes. Additionally, individual blocks may be deleted from the processes without departing from the spirit and scope of the subject matter described herein. Furthermore, while this process is described with reference to the receiver 602 of FIG. 6, other hardware and/or software architectures may implement one or more portions of this process, in whole or in part. In various preferred embodiments, the components of receiver 602 are selected to provide real time decoding of blocks of binary bits from blocks of RP symbol estimates during high speed (e.g., ≥1 Gbps) data transmission.

At block 702, a multi-level symbol (e.g., RP symbol) is received by a receiver. As an example, receiver 602 receives, demodulates and processes an RPC encoded signal received over noisy channel 606 to generate a block of M estimated RP symbols that are associated with a block of N desired binary source bits, such as source bits 204.

At block 704, a multi-level symbol is associated with a node. As an example, RPC-BP decoder 622 may abstractly represent received multi-level RP symbols as constraint nodes of a bipartite graph, where each constraint node is connected to neighboring variable nodes by weighted edges of the bipartite graph. FIG. 3 illustrates an example of weighted edge connections between constraint node 318 and neighboring binary variable nodes 302-316.

At block 706, a probability distribution function (PDF) is computed by performing a convolution of probabilities of neighboring nodes of the node. As an example, probability distributions of probabilities of each variable node 302-316 (e.g., probabilities associated with a priori probability distributions of neighboring binary nodes), distributed according to a corresponding edge weight of each of nodes 302-316 (e.g., distribution 320), are convolved together to generate the PDF of all neighboring variable nodes at each iteration of a belief propagation algorithm. The convolution may be performed by RPC-BP decoder 622 as shown in eq. (4).

At block 708, a partial probability distribution function is computed for each of the neighboring binary nodes by performing a deconvolution that includes subtracting one or more scaled and shifted values of the PDF from one or more other values of the PDF. As an example, to reduce computational complexity, the deconvolution is a ZigZag deconvolution performed by various techniques as described herein. As an example, the ZigZag deconvolution further includes selecting one or more values from the PDF that when scaled by a known scale factor, equal one or more values of a respective partial probability distribution function. As part of the ZigZag deconvolution, the shifted values of the PDF are shifted in a direction of left-to-right or right-to-left across the PDF in the performing of the ZigZag deconvolution. The direction is determined based at least in part on a probability of a value of a respective neighboring binary node, such as whether a probability of a zero is greater than a probability of a one for a respective neighboring binary node, as shown in eqs. (13) and (14).

At block 710, a message is computed indicating a likelihood of the probabilities for each of the neighboring binary nodes, wherein each message is determined based at least in part on the partial probability distribution function of the respective neighboring binary node. As an example, using messages associated with variable nodes 302-316 as part of a belief propagation algorithm, RPC-BP decoder 622 computes messages associated with constraint node 318 by computing a convolution for all neighboring variable nodes 302-316, as well as computing the partial probability distribution functions for each variable node 302-316 using ZigZag deconvolution. Then, RPC-BP decoder 622 computes constraint node 318 messages (e.g., eq. 8) using the partial probability distribution functions, the received RP symbol estimate (e.g., $S_c$ of FIG. 3), and a noise PDF for channel 606. RPC-BP decoder 622 the iteratively computes variable node and constraint node messages (e.g., eqs. 8 and 11) until convergence of the belief propagation algorithm is determined or a pre-specified number of iterations have occurred.

CONCLUSION

Although the subject matter has been described in language specific to structural features and/or methodological operations, it is to be understood that the subject matter defined in the appended claims is not necessarily limited to the specific features or operations described. Rather, the specific features and acts are disclosed as example forms of implementing the claims.

What is claimed is:
1. A method comprising:
  receiving, as a received multi-level symbol, a multi-level symbol by a receiver over a channel that contributes a noise value to a value of the received multi-level symbol;
  associating the received multi-level symbol with a node and with at least one binary value associated with neighboring binary nodes;
  computing, by one or more processors, a probability distribution function (PDF) by performing a convolution of probabilities of the neighboring binary nodes of the node;

computing, by the one or more processors, a partial probability distribution function for each of the neighboring binary nodes by performing a deconvolution that includes subtracting one or more scaled and shifted values of the PDF from one or more other values of the PDF;

computing, by the one or more processors, a message indicating a likelihood of the probabilities for each of the neighboring binary nodes, wherein the message is determined based at least in part on the partial probability distribution function of a respective neighboring binary node of the neighboring binary nodes, the message including at least a first probability that the at least one binary value is a zero bit and a second probability that the at least one binary value is a one bit; and decoding, by the one or more processors, based at least in part on the first probability and the second probability, an estimate bit value of the at least one binary value, the estimate bit value representing at least a portion of the received multi-level symbol without contribution of the noise value.

2. The method as recited in claim 1, wherein the message is computed as a part of a belief propagation (BP) algorithm for determining a desired bit sequence at the neighboring binary nodes.

3. The method as recited in claim 1, wherein the node represents a constraint node in a bipartite graph and the neighboring binary nodes represent variable nodes connected to the constraint node by weighted edges of the bipartite graph.

4. The method as recited in claim 1, wherein the received multi-level symbol is a random projection (RP) symbol that has a number of levels greater than 2.

5. The method as recited in claim 1, wherein the probabilities of the neighboring binary nodes are distributed as probability distributions that are decided according to edge weights between the node and the neighboring binary nodes and a priori probability distributions of the neighboring binary nodes.

6. The method as recited in claim 5, wherein the probability distributions for each of the neighboring binary nodes include a binary probability distributed at zero and at a value of an edge weight between the node and the respective neighboring binary node.

7. The method as recited in claim 1, wherein each message is further determined based at least in part on the value of the received multi-level symbol received by the receiver over the channel.

8. The method as recited in claim 1, wherein the message is further determined based at least in part on a noise PDF associated with the channel.

9. The method as recited in claim 1, wherein the deconvolution is a ZigZag deconvolution.

10. The method as recited in claim 9, wherein performing the ZigZag deconvolution further includes selecting one or more values from the PDF and scaling the one or more values from the PDF by a known scale factor to equal one or more values of the partial probability distribution function.

11. The method as recited in claim 9, wherein the shifted values of the PDF are shifted in a direction of left-to-right or right-to-left across the PDF in the performing of the ZigZag deconvolution.

12. The method as recited in claim 11, wherein the direction is determined based at least in part on a probability of the value of the respective neighboring binary node.

13. A system comprising:
a processing unit configured to:
receive, as a received multi-level symbol, a multi-level symbol from a receiver over a channel that contributes a noise value to a value of received the multi-level symbol;

represent the received multi-level symbol as a node of a graph;

compute a probability distribution function (PDF) by performing a convolution of probabilities of binary nodes connected to the node by weighted edges of the graph, the binary nodes associated with at least one binary value;

compute a partial probability distribution function for each of the binary nodes connected to the node by performing a deconvolution that includes selecting one or more values from the PDF and scaling the one or more values from the PDF by a known scale factor to equal one or more values of the partial probability distribution function;

compute a message indicating a likelihood of the probabilities for each of the binary nodes connected to the node based at least in part on the partial probability distribution function of a neighboring binary node, the message including at least a first probability that the at least one binary value is a zero bit and a second probability that the at least one binary value is a one bit; and decode, based at least in part on the first probability and the second probability, an estimate bit value of the at least one binary value, the estimate bit value representing at least a portion of the received multi-level symbol without contribution of the noise value.

14. The system of claim 13, wherein:
the graph is a bipartite graph; and
the message is computed as a part of a belief propagation (BP) algorithm to determine a desired bit sequence associated with the received multi-level symbol.

15. The system of claim 13, wherein the probabilities of the binary nodes connected to the node are distributed according to edge weights of the weighted edges between the node and the neighboring binary node.

16. The system of claim 13, wherein the deconvolution is a ZigZag deconvolution, and performing the ZigZag deconvolution further includes subtracting one or more scaled and shifted values of the PDF from one or more other values of the PDF.

17. The system of claim 16, wherein the shifted values of the PDF are shifted in a direction of left-to-right or right-to-left across the PDF in the performing of the ZigZag deconvolution, the direction being determined based at least in part on whether a probability of a zero is greater than a probability of a one for a respective binary node connected to the node.

18. A system comprising:
a receiver to receive, as received multi-level symbols, multi-level symbols over a channel that contributes a noise value to a value of the received multi-level symbols, the received multi-level symbols corresponding to a desired block of binary source bits; and a processing unit configured to:
represent each received multi-level symbol of the received multi-level symbols as a corresponding node of a graph;

for each corresponding node of the graph:
compute a probability distribution function (PDF) by performing a convolution of probabilities of binary nodes connected to the corresponding node by weighted edges of the graph;

compute a partial probability distribution function for each of the binary nodes connected to the corresponding node by performing a ZigZag deconvolution in a direction that is determined based on a probability of a value of the respective binary node; and compute one or more messages indicating a likelihood of the probabilities for each of the binary nodes connected to the corresponding node based at least in part on the partial probability distribution function of a neighboring binary node, the one or messages including at least a first probability that the value is a zero bit and a second probability that the value is a one bit; and decode, based at least in part on the first probability and the second probability, the received multi-level symbols as the desired block of binary source bits, the desired block of source bits decoded by removing a noise value associated with the received multi-level symbols.

19. The system of claim 18, wherein the graph is a bipartite graph and the processing unit computes the one or more messages as part of a belief propagation (BP) to decode the received multi-level symbols to the desired block of binary source bits.

20. The method of claim 1, further comprising adjusting a transmission rate of the channel based at least in part on the received multi-level symbol received by the receiver.

* * * * *